(12) United States Patent
Matsuzawa et al.

(10) Patent No.: US 11,735,463 B2
(45) Date of Patent: Aug. 22, 2023

(54) PROCESSING METHOD FOR WAFER

(71) Applicant: DISCO CORPORATION, Tokyo (JP)

(72) Inventors: Minoru Matsuzawa, Tokyo (JP);
Yusuke Vincent Fujii, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 139 days.

(21) Appl. No.: 16/990,503

(22) Filed: Aug. 11, 2020

(65) Prior Publication Data
US 2021/0057260 A1 Feb. 25, 2021

(30) Foreign Application Priority Data
Aug. 19, 2019 (JP) .................. 2019-149721

(51) Int. Cl.
| | |
|---|---|
| B29C 65/00 | (2006.01) |
| H01L 21/683 | (2006.01) |
| H01L 21/78 | (2006.01) |
| H01L 21/304 | (2006.01) |
| B29C 65/02 | (2006.01) |
| B29C 65/44 | (2006.01) |

(52) U.S. Cl.
CPC ........ *H01L 21/6836* (2013.01); *H01L 21/304* (2013.01); *H01L 21/78* (2013.01); *B29C 65/02* (2013.01); *B29C 65/44* (2013.01)

(58) Field of Classification Search
CPC ...... B29C 65/02; B29C 65/44; H01L 21/6836
See application file for complete search history.

(56) References Cited

U.S. PATENT DOCUMENTS

| | | | | |
|---|---|---|---|---|
| 6,066,562 | A | * | 5/2000 | Ohshima ............... H01L 21/306 125/11.01 |
| 7,064,012 | B1 | * | 6/2006 | Lin .................. H01L 23/49816 257/E21.175 |
| 2003/0064579 | A1 | * | 4/2003 | Miyakawa ................ C09J 7/29 438/643 |
| 2003/0075275 | A1 | * | 4/2003 | Kubota .................. B29C 43/18 156/499 |

(Continued)

FOREIGN PATENT DOCUMENTS

| | | |
|---|---|---|
| JP | 2005246491 A | 9/2005 |
| JP | 2019186489 A * | 10/2019 |

OTHER PUBLICATIONS

English translation of JP 2019/186489 (Year: 2018).*

*Primary Examiner* — Philip C Tucker
*Assistant Examiner* — Nickolas R Harm
(74) *Attorney, Agent, or Firm* — Greer Burns & Crain, Ltd.

(57) ABSTRACT

A processing method for a wafer includes a thermocompression-bonding sheet arrangement step of arranging, on a front side of the wafer, a thermocompression-bonding sheet of a size sufficient to cover the wafer, an integration step of pressing the thermocompression-bonding sheet under heat by a planarizing member, so that the thermocompression-bonding sheet is planarized and the thermocompression-bonding sheet and the wafer are integrated together, a grinding step of holding the wafer on a side of the thermocompression-bonding sheet on a chuck table of a grinding apparatus and grinding the wafer to a desired thickness while supplying grinding water to a back side of the wafer, and a thermocompression-bonding sheet rinsing step of unloading the integrated wafer from the chuck table and rinsing the thermocompression-bonding sheet.

19 Claims, 6 Drawing Sheets

(56) References Cited

U.S. PATENT DOCUMENTS

| | | | |
|---|---|---|---|
| 2005/0150860 A1* | 7/2005 | Fujisawa | H01L 21/67069 216/2 |
| 2005/0191858 A1* | 9/2005 | Fukunaga | B24B 49/16 451/5 |
| 2006/0134406 A1* | 6/2006 | Horigome | C09J 7/29 156/752 |
| 2007/0277861 A1* | 12/2007 | Hiroe | H01L 21/67276 156/345.31 |
| 2009/0017248 A1* | 1/2009 | Larson | C09J 7/38 428/41.5 |
| 2009/0199957 A1* | 8/2009 | Inao | H01L 21/6835 156/154 |
| 2011/0297300 A1* | 12/2011 | Furuya | C09J 183/04 156/154 |
| 2017/0345695 A1* | 11/2017 | Robissa | B65G 47/911 |
| 2018/0040469 A1* | 2/2018 | Seddon | H01L 21/0209 |
| 2019/0378758 A1* | 12/2019 | Harada | H01L 21/67092 |
| 2019/0385887 A1* | 12/2019 | Kiuchi | H01L 21/6836 |
| 2019/0393089 A1* | 12/2019 | Zhao | B23K 26/364 |
| 2020/0058537 A1* | 2/2020 | Sekiya | H01L 21/67132 |
| 2020/0343095 A1* | 10/2020 | Harada | B23K 26/36 |

* cited by examiner

PROCESSING METHOD FOR WAFER

BACKGROUND OF THE INVENTION

Field of the Invention

The present invention relates to a processing method for a wafer, on a front side of which a plurality of devices is formed in a grid pattern defined by a plurality of intersecting lines (streets), to grind the wafer on a back side thereof.

Description of the Related Art

A wafer, on a front side of which a plurality of devices such as integrated circuits (ICs) or large-scale integrations (LSIs), is formed in a grid pattern defined by a plurality of intersecting streets, is protected by an adhesive tape bonded on the front side, and is then held on the side of the protective tape on a chuck table of a grinding apparatus, followed by grinding of a back side thereof so that the wafer is formed to a desired thickness (see, for example, JP 2005-246491 A).

The wafer formed to the desired thickness as described above is divided into individual device chips by a dicing apparatus or a laser processing apparatus, and the divided device chips are used in electronic equipment such as mobile phones or personal computers.

The grinding apparatus is generally configured from a chuck table for holding a wafer thereon, a grinding unit rotatably including grinding stones to grind the wafer held on the chuck table, a grinding water supply means supplying grinding water to the wafer and the grinding stones, and a rinsing unit rinsing the ground wafer, and hence can grind the wafer to a desired thickness.

SUMMARY OF THE INVENTION

When a wafer is ground on a back side thereof by a grinding apparatus, most of grinding swarf occurred through the grinding is caused to flow out of the chuck table by grinding water. As a negative pressure is applied to an upper surface (holding surface) of the chuck table to hold the wafer under suction, however, some of the grinding swarf enters from a gap between the chuck table and a protective tape, and sticks to the side of a lower surface of the protective tape that is bonded on the wafer held by the chuck table. Especially if a protective tape is bonded on a front side of a wafer via an adhesive or the like, waviness is formed on the side of the front side of the wafer. This waviness lowers the degree of close contact between the chuck table and the protective tape, and can act as a cause of entrance of grinding swarf into a gap between the chuck table and the protective tape. After completion of the grinding as described above, the wafer is rinsed on the ground surface thereof by a rinsing unit arranged on the grinding apparatus. However, no sufficient rinsing is applied to the side of the protective tape of the wafer held on the chuck table, thereby raising a problem that the wafer becomes a source of contamination when transferred to the next step.

The present invention therefore has as an object thereof the provision of a processing method for a wafer held on a chuck table, which can sufficiently remove grinding swarf stuck on the ground wafer.

In accordance with an aspect of the present invention, there is provided a processing method for a wafer, on a front side of which a plurality of devices are formed in a grid pattern defined by a plurality of intersecting streets, to grind a back side of the wafer processing method, including a thermocompression-bonding sheet arrangement step of arranging, on the front side of the wafer, a thermocompression-bonding sheet of a size sufficient to cover the wafer, an integration step of pressing the thermocompression-bonding sheet under heat by a planarizing member, so that the thermocompression-bonding sheet is planarized and the thermocompression-bonding sheet and the wafer are integrated together, a grinding step of, after the integration step, holding the wafer on a side of the thermocompression-bonding sheet on a chuck table of a grinding apparatus, and grinding the wafer to a desired thickness while supplying grinding water to the back side of the wafer, and a thermocompression-bonding sheet rinsing step of, after the grinding step, unloading the integrated wafer and the thermocompression-bonding sheet from the chuck table, and rinsing the thermocompression-bonding sheet.

Preferably, the processing method may further include a separation step of, after the thermocompression-bonding sheet rinsing step, locally heating or cooling the thermocompression-bonding sheet to induce a temperature difference in the thermocompression-bonding sheet, and separating the thermocompression-bonding sheet from the front side of the wafer.

Preferably, the thermocompression-bonding sheet may be formed from a polyolefin-based sheet or a polyester-based sheet. The thermocompression-bonding sheet may preferably be a polyolefin-based sheet selected from a group consisting of a polyethylene sheet, a polypropylene sheet, and a polystyrene sheet. In the integration step, the thermocompression-bonding sheet may preferably be pressed at 120° C. to 140° C., 160° C. to 180° C., or 220° C. to 240° C. if the thermocompression-bonding sheet is the polyethylene sheet, the polypropylene sheet, or the polystyrene sheet, respectively.

Preferably, the thermocompression-bonding sheet may preferably be a polyester-based sheet selected from the group consisting of a polyethylene terephthalate sheet and a polyethylene naphthalate sheet. In the integration step, the thermocompression-bonding sheet may preferably be pressed at 250° C. to 270° C. or 160° C. to 180° C. if the thermocompression-bonding sheet is the polyethylene terephthalate sheet or the polyethylene naphthalate sheet, respectively.

According to the processing method of the present invention for the wafer, even if the grinding step is performed with the wafer held on the chuck table, grinding swarf is suppressed from entering a gap between the thermocompression-bonding sheet and the holding surface of the chuck table and sticking to the thermocompression-bonding sheet. Even if grinding swarf sticks to a surface of a thermocompression-bonding sheet as a result of performance of the grinding step, removal of the grinding swarf from the surface of the thermocompression-bonding sheet is ensured through the thermocompression-bonding sheet rinsing step, thereby resolving the problem that the wafer becomes a cause of contamination in a next step when transferred to the next step.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

With reference to the attached drawings, a description will hereinafter be made in detail regarding a processing method of an embodiment of the present invention for a wafer. The processing method of the embodiment for the wafer includes a thermocompression-bonding sheet arrangement step of arranging, on a front side of the wafer, a thermocompression-bonding sheet of a size sufficient to cover the wafer, an integration step of planarizing the thermocompression-bonding sheet and integrating the thermocompression-bonding sheet and the wafer together, a grinding step of holding the wafer on a side of the thermocompression-bonding sheet on a chuck table of a grinding apparatus and grinding the wafer to a desired thickness while supplying grinding water to a back side of the wafer, and a thermocompression-bonding sheet rinsing step of unloading the wafer and the thermocompression-bonding sheet integrated therewith from the chuck table and rinsing the thermocompression-bonding sheet. A description will hereinafter be sequentially made regarding the individual steps.

(Thermocompression-Bonding Sheet Arrangement Step)

Figure 1A:
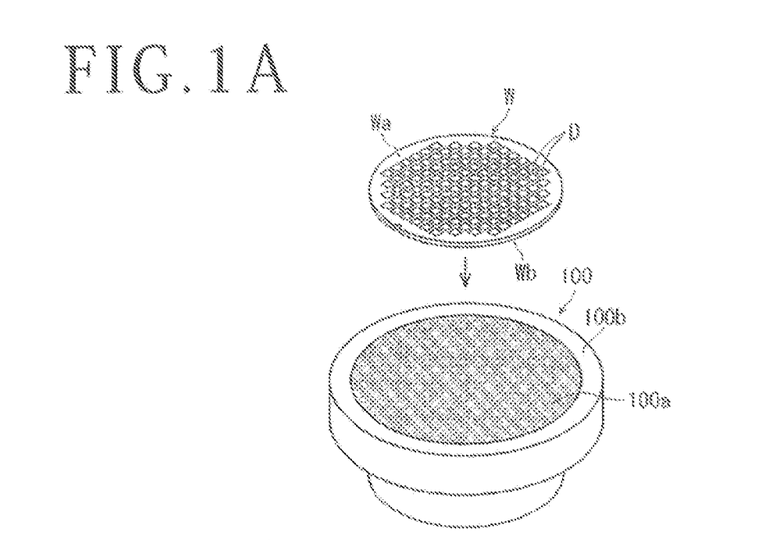
FIG. 1A is a perspective view depicting a scene of placing a wafer on a chuck table.
Figure 1B:
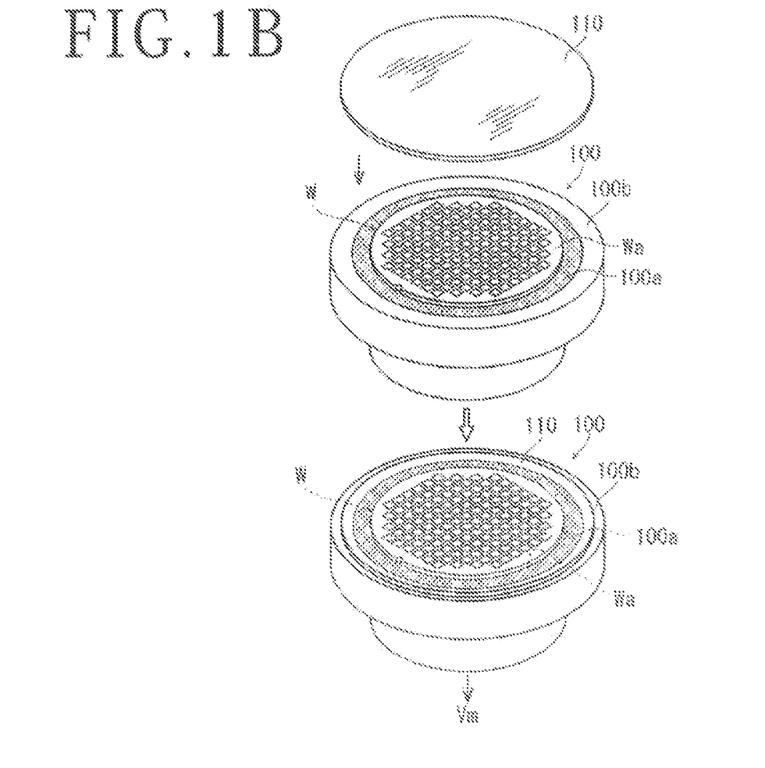
FIG. 1B is a perspective view depicting an illustrative performance of a thermocompression-bonding sheet arrangement step in a processing method according to an embodiment of the present invention for the wafer.

FIGS. 1A and 1B sequentially depict perspective views of illustrative performance of the thermocompression-bonding sheet arrangement step. The thermocompression-bonding sheet arrangement step is performed before the grinding step to be described subsequently herein. When performing the thermocompression-bonding sheet arrangement step, a wafer W as an object of machining and a chuck table 100, which will be used to perform the thermocompression-bonding sheet arrangement step, are first provided as depicted in FIG. 1A. The wafer W is made, for example, from silicon (Si), and a plurality of devices D is formed on a front side Wa in a grid pattern defined by a plurality of intersecting streets. The chuck table 100 is formed from a disc-shaped suction chuck 100a made from a porous ceramic having air permeability, and a circular frame 100b surrounding an outer periphery of the suction chuck 100a. The chuck table 100 is connected to undepicted suction means and can hold under suction the wafer W placed on an upper surface (holding surface) of the suction chuck 100a.

After the provision of the wafer W and the chuck table 100, the wafer W is placed on a center of the suction chuck 100a of the chuck table 100, with a back side Wb of the wafer W facing downward, as depicted in FIG. 1A. After the placement of the wafer W on the suction chuck 100a, a circular thermocompression-bonding sheet 110 formed with a thickness of 20 to 100 µm is placed on the front side Wa of the wafer W as depicted in FIG. 1B. As the thermocompression-bonding sheet 110, a polyolefin-based sheet or a polyester-based sheet can be selected. In the case of the polyolefin-based sheet, a polyethylene (PE) sheet is selected, for example. As appreciated from FIG. 1B, the suction chuck 100a has a diameter set a little greater than a diameter of the wafer W, so that the placement of the wafer W on the center of the suction chuck 100a brings the suction chuck 100a into a state that it is exposed surrounding an outer periphery of the wafer W. In addition, the thermocompression-bonding sheet 110 has a size sufficient to cover at least the wafer W. Preferably, the thermocompression-bonding sheet 110 is formed with a diameter which is greater than that of the suction chuck 100a and slightly smaller than that of the circular frame 100b of the chuck table 100. As a consequence, the suction chuck 100a is covered over an entire surface thereof by the thermocompression-bonding sheet 110, and so the wafer W. It is to be noted that an adhesive layer such as an adhesive is not formed on one side of the thermocompression-bonding sheet 110, the one side being placed on the wafer W.

The above described thermocompression-bonding sheet 110 is a sheet that exhibits an adhesive force when heated, and is not limited to the polyethylene sheet described above. If a polyolefin-based sheet is adopted as the thermocompression-bonding sheet 110, a polypropylene (PP) sheet or a polystyrene (PS) sheet can be adopted, for example, instead of the polyethylene sheet described above. If a polyester-based sheet is adopted as the thermocompression-bonding sheet 110, either a polyethylene terephthalate (PET) sheet or a polyethylene naphthalate (PEN) sheet can be adopted, for example.

After the placement of the wafer W and the thermocompression-bonding sheet 110 on the chuck table 100, the undepicted suction means with a suction pump or the like included therein is operated to apply a suction force Vm to the suction chuck 100a so that, as depicted in FIG. 1B, the wafer W and the thermocompression-bonding sheet 110 are attracted under suction. As described above, the upper surface (holding surface) of the suction chuck 100a is covered in its entirety by the thermocompression-bonding sheet 110, and so the wafer W. Therefore, the suction force Vm acts on the entire wafer W and the thermocompression-bonding sheet 110, the wafer W and the thermocompression-bonding sheet 110 are held under suction on the suction chuck 100a, and any air remaining between the wafer W and the thermocompression-bonding sheet 110 is suctioned to bring both of them into close contact with each other. On the front side Wa of the wafer W, minute protrusions and recesses are formed by the devices D. When held under suction by the chuck table 100, the thermocompression-bonding sheet 110 remains in a state of close contact with the protruding and recessed surface or the front side Wa of the wafer W. The thermocompression-bonding sheet arrangement step has now been completed.

(Integration Step)

After the above described performance of the thermocompression-bonding sheet arrangement step, the integration step is performed. Regarding the integration step, a description will be made with reference to FIGS. 2 and 3.

Figure 2:
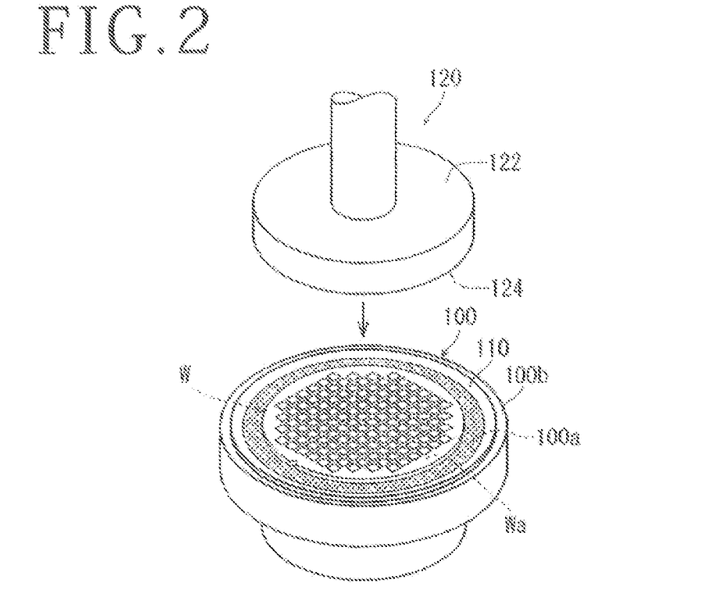
FIG. 2 is a perspective depicting an illustrative performance of an integration step in the processing method.

When performing the integration step, as depicted in FIG. 2, integration means 120, only a portion of which is depicted, is positioned above the chuck table 100 with the wafer W and the thermocompression-bonding sheet 110 held under suction thereon to planarize the thermocompression-bonding sheet 110 and to integrate the thermocompression-bonding sheet 110 and the wafer W together. The integration means 120 includes a disc-shaped planarizing member 122 with a heater and a temperature sensor (illustration omitted) incorporated therein, and its lower surface 124 is a planar surface coated with a fluororesin. The planarizing member 122 has a diameter that is set equal to or greater than at least the wafer W.

After the positioning of the integration means 120 above the chuck table 100, the heater incorporated in the integration means 120 is operated, the planarizing member 122 is lowered to press the thermocompression-bonding sheet 110 arranged on the wafer W. By the operation of the heater and the temperature sensor of the planarizing member 122, the lower surface 124 of the planarizing member 122 is controlled to remain at 120° C. to 140° C. The thermocompression-bonding sheet 110 in the embodiment is the polyethylene sheet as described above. When heated to 120° C. to 140° C., the polyethylene sheet is heated close to its melting point, exhibits an adhesive force, and is softened. As the thermocompression-bonding sheet 110 is in close contact with the minute protruding and recessed surface formed by the devices D on the front side Wa of the wafer W, the degree of close contact between the thermocompression-bonding sheet 110, which has been softened by the heating, and the front side Wa of the wafer W increases, so that the thermocompression-bonding sheet 110 is bonded to the front side Wa of the wafer W under the action of the adhesive force of the thermocompression-bonding sheet 110.

Further, the lower surface 124 of the planarizing member 122 is the planar surface so that the surface of the thermocompression-bonding sheet 110 bonded to the front side Wa of the wafer W is planarized. The integration step has now been completed, and therefore the wafer W and the thermocompression-bonding sheet 110 have been integrated together. As the fluororesin is coated on the lower surface 124 of the planarizing member 122 as described above, the planarizing member 122 can be readily separated from the thermocompression-bonding sheet 110 despite the exhibition of the adhesive force by the thermocompression-bonding sheet 110 through its heating.

In the above described integration step, an example is presented in which the heater-incorporated planarizing member 122 as depicted in FIG. 2 is used as the device that integrates the wafer W and the thermocompression-bonding sheet 110 together by planarizing the thermocompression-bonding sheet 110 under heat, but the present invention is not limited to such an example. For example, a planer member similar to the planarizing member 122 except of the omission of the heater may be provided, and heating means may also be provided in addition to the planer member. The thermocompression-bonding sheet 110 is heated to a predetermined temperature by the heating means. The thus-heated thermocompression-bonding sheet 110 can then be pressed and planarized by the planarizing member. As a further alternative, the thermocompression-bonding sheet 110 can also be planarized on a surface thereof by irradiating an infrared ray to the surface to heat the same and then pressing the heated surface with a roller or the like or by heating and at the same time pressing the thermocompression-bonding sheet 110 with a roller in which a heater and a temperature sensor are incorporated.

Figure 3:
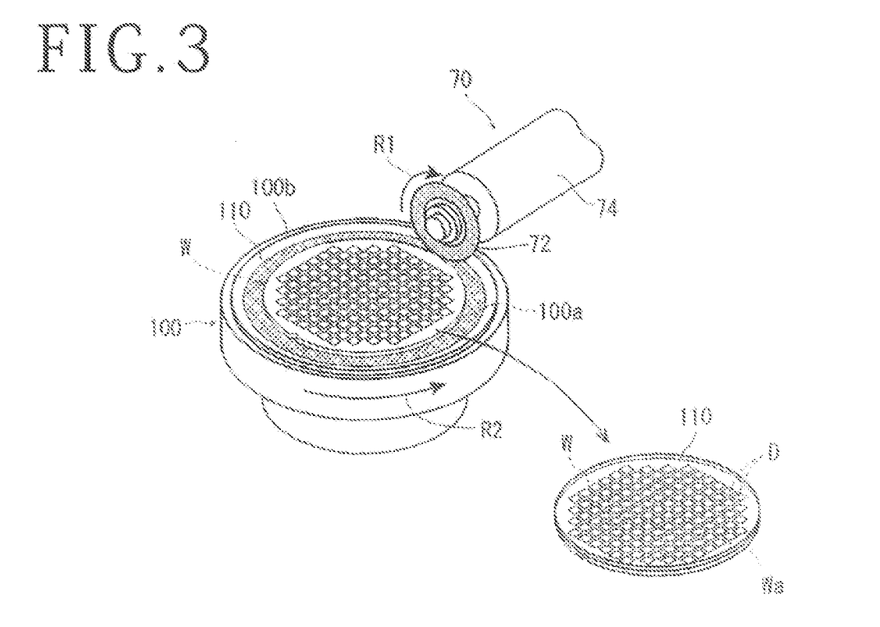
FIG. 3 is a perspective view depicting an illustrative performance of a cutting step in the processing method.

In the embodiment, subsequent to the integration step described above, a cutting step is performed to cut the thermocompression-bonding sheet 110 along the shape of the wafer W in consideration of a grinding step to be performed as a next step. Performance of this cutting step is not absolutely needed, but its performance facilitates the handling of the wafer W integrated with the thermocompression-bonding sheet 110 and is convenient for the grinding step to be described subsequently herein. With reference to FIG. 3, a description will hereinafter be made regarding the cutting step.

(Cutting Step)

As depicted in FIG. 3, cutting means 70, only a portion of which is depicted, is positioned on the chuck table 100 with the wafer W and the thermocompression-bonding sheet 110 held under suction. Described more specifically, the cutting means 70 includes a disc-shaped cutting blade 72 for cutting the thermocompression-bonding sheet 110 and a motor 74 for rotationally driving the cutting blade 72 in a direction indicated by arrow R1, and is positioned so that the cutting blade 72 comes at a cutting edge thereof to the position of the outer periphery of the wafer W. After the positioning of the cutting edge of the cutting blade 72 to the position of the outer periphery of the wafer W, the cutting blade 72 is fed for cutting as much as the thickness of the thermocompression-bonding sheet 110, and the chuck table 100 is rotated in a direction indicated by arrow R2. As a consequence, the thermocompression-bonding sheet 110 is cut along the outer periphery of the wafer W so that any surplus portion of the thermocompression-bonding sheet 110, the surplus portion protruding from the outer periphery of the wafer W, can be cut off. The cutting step has now been completed.

(Grinding Step and Thermocompression-Bonding Sheet Rinsing Step)

Figure 4:
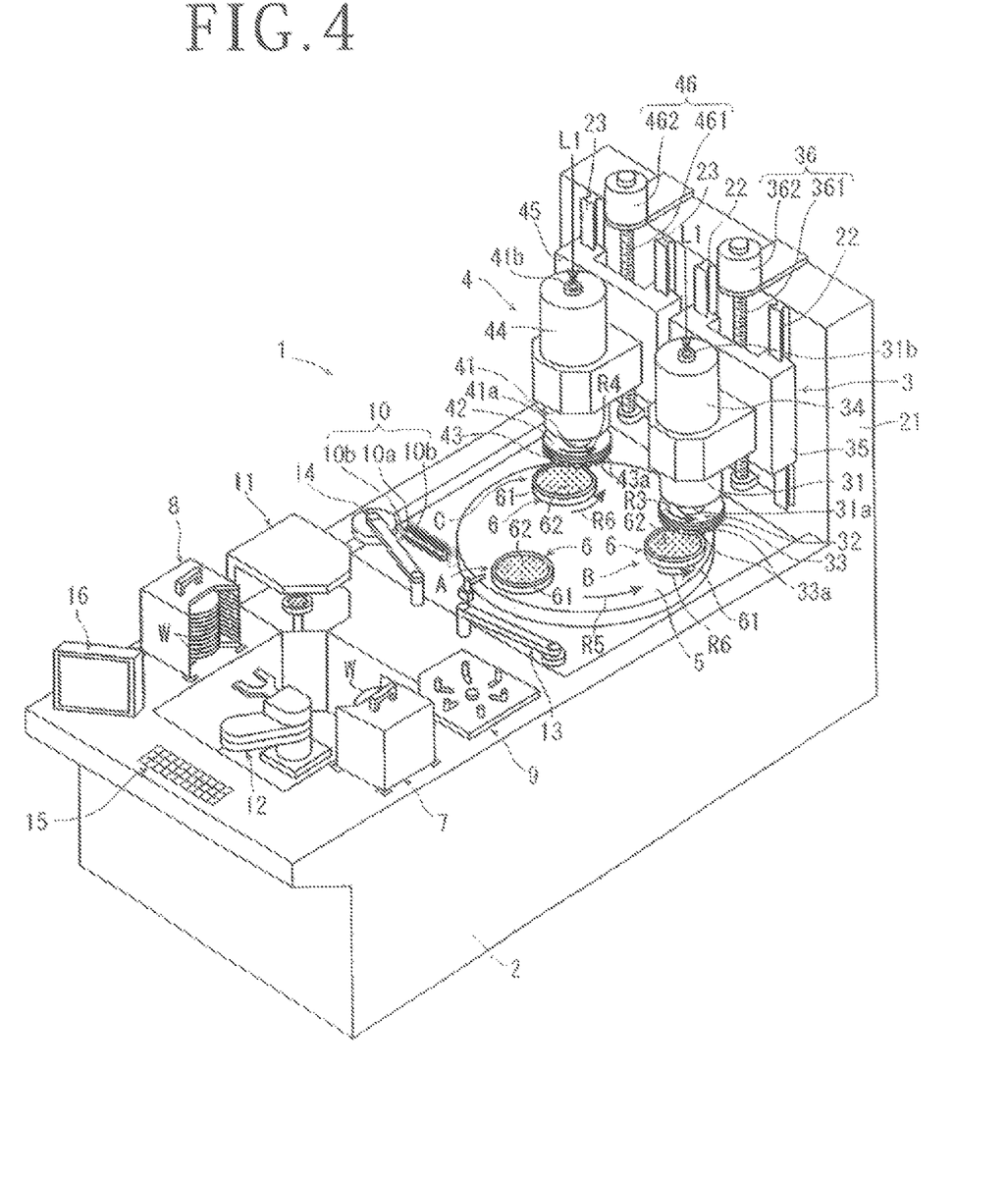
FIG. 4 is an overall perspective view of a grinding apparatus suited for the embodiment.

After the integration of the wafer W and the thermocompression-bonding sheet through the integration step, the grinding step, and the thermocompression-bonding sheet rinsing step are performed to grind the back side Wb of the wafer W and to rinse the wafer W on the side of the thermocompression-bonding sheet 110, respectively. With reference to FIG. 4, a description will hereinafter be made regarding a grinding apparatus 1 suited for performing the grinding step and the thermocompression-bonding sheet rinsing step.

The grinding apparatus 1 includes a substantially rectangular parallelepipedal machine housing 2. In FIG. 4, a stationary support board 21 is disposed upright on a right-side upper end of the machine housing 2. On an inner wall surface of the stationary support board 21, two pairs of guide rails 22 and 23 are disposed extending in a top-down direction. On one pair of guide rails 22, a coarse grinding unit 3 is fitted as the coarse grinding unit movably in the top-down direction, and on the other pair of guide rails 23, a finish grinding unit 4 is fitted as the finish grinding unit movably in the top-down direction.

The coarse grinding unit 3 includes a unit housing 31, a coarse grinding wheel 33, an electric motor 34, and a moving base 35 with the unit housing 31 attached thereto. The coarse grinding wheel 33 is mounted on a wheel mount 32 attached to a lower end of a spindle 31a rotatably supported on the unit housing 31, and carries a plurality of grinding stones 33a in a ring-shaped pattern on a lower surface thereof. The electric motor 34 is mounted on an upper end of the unit housing 31, and rotates the wheel mount 32 in a direction indicated by arrow R3. The moving base 35 is supported by the guide rails 22 disposed on the stationary support board 21, so that the coarse grinding unit 3 is moved in the top-down direction. The grinding apparatus 1 in the embodiment includes a grinding feed mechanism 36 that performs grinding feed of the moving base 35 of the coarse grinding unit 3 in the top-down direction. The grinding feed mechanism 36 includes an externally threaded rod 361 arranged in the top-down direction in parallel with the guide rails 22 and rotatably supported on the stationary support board 21, a pulse motor 362 for rotationally driving the externally threaded rod 361, and an undepicted internally threaded block attached to the moving base 35 and maintained in threaded engagement with the externally threaded rod 361. By driving the externally threaded rod 361 in normal and reverse directions with the pulse motor 362, the coarse grinding unit 3 is moved in the top-down direction.

The finish grinding unit 4 is also configured in substantially similar to the above described coarse grinding unit 3, and includes a unit housing 41, a finish grinding wheel 43, an electric motor 44, and a moving base 45 with the unit housing 41 attached thereto. The finish grinding wheel 43 is mounted on a wheel mount 42 attached to a lower end of a spindle 41a rotatably supported on the unit housing 41, and carries a plurality of grinding stones 43a in a ring-shaped pattern on a lower surface thereof. The electric motor 44 is mounted on an upper end of the unit housing 41, and rotates the wheel mount 42 in a direction indicated by arrow R4. The moving base 45 is supported by the guide rails 23 disposed on the stationary support board 21, so that the finish grinding unit 4 is moved in the top-down direction. It is to be noted that the grinding stones 43a of the finish grinding unit 4 are formed by abrasive grains finer than those of the grinding stones 33a of the coarse grinding unit 3. The grinding apparatus 1 in the embodiment includes a grinding feed mechanism 46 that moves the moving base 45 of the finish grinding unit 4 along the guide rails 23. The grinding feed mechanism 46 includes an externally threaded rod 461 arranged in the top-down direction in parallel with the guide rails 23 and rotatably supported on the stationary support board 21, a pulse motor 462 for rotationally driving the externally threaded rod 461, and an undepicted internally threaded block attached to the moving base 45 and maintained in threaded engagement with the externally threaded rod 461. By driving the externally threaded rod 461 in normal and reverse directions with the pulse motor 462, the finish grinding unit 4 is moved in the top-down direction.

To spindle ends 31b and 41b of the spindles 31a and 41a rotated by the electric motors 34 and 44, an undepicted grinding water supply means is connected. The grinding water supply means includes a grinding water tank with a pressure pump incorporated therein, introduces grinding water L1, which has been pumped from the grinding water tank, to the spindles 31a and 41a, supplies the grinding water L1 via through-holes formed inside the spindles 31a and 41a, and ejects the grinding water L1 from lower end surfaces of the coarse grinding wheel 33 and finish grinding wheel 43.

The grinding apparatus 1 in the embodiment includes a turn table 5 arranged so that the turn table 5 lies substantially in flush with an upper surface of the machine housing 2 on a front side of the stationary support board 21. The turn table 5 is formed in a relatively large disc shape, and is rotated as needed in a direction indicated by arrow R5 by an undepicted rotary drive mechanism. In the case of the embodiment, three chuck tables 6 are arranged at equal intervals on the turn table 5. The chuck tables 6 are each constructed of a disc-shaped frame 61 and a suction chuck 62 formed with a porous ceramic material, and a workpiece placed on the suction chuck 62 is held under suction by operating the undepicted suction means. The frame 61 forms an outer edge portion that supports and surrounds the suction chuck 62. An upper surface of the suction chuck 62 and the outer edge portion of the frame 61 are configured so that their heights flush with each other. The chuck table 6 configured as described above is rotated in a direction indicated by arrow R6 by an undepicted rotary drive mechanism. The three chuck tables 6 arranged on the turn table 5 are sequentially moved in the order of a workpiece loading/unloading zone A→a coarse grinding zone B→a finish grinding zone C→the workpiece loading/unloading zone A whenever the turn table 5 is rotated by 120 degrees in the direction indicated by arrow R5.

The grinding apparatus 1 includes a first cassette 7, a second cassette 8, a temporary storage region 9, a thermocompression-bonding sheet rinsing unit 10, and a ground-surface rinsing unit 11. The first cassette 7 is arranged on one side relative to the workpiece loading/unloading zone A, and stocks wafers which are pre-grinding workpieces. The second cassette 8 is arranged on the other side relative to the workpiece loading/unloading zone A, and stocks wafers which are post-grinding workpieces. The temporary storage region 9 is arranged between the first cassette 7 and the workpiece loading/unloading zone A, and performs centering of workpieces. The thermocompression-bonding sheet rinsing unit 10 is arranged between the workpiece loading/unloading zone A and the second cassette 8. In addition, the grinding apparatus 1 also includes a first transfer mechanism 12, a second transfer mechanism 13, and a third transfer mechanism 14. The first transfer mechanism 12 transfers each wafer, which is stored in the first cassette 7, to the temporary storage region 9, and also transfers each wafer, which has been rinsed in the ground-surface rinsing unit 11, to the second cassette 8. The second transfer mechanism 13 transfers each wafer, which has been placed at the temporary storage region 9 and has been subjected to centering, onto the chuck table 6 positioned at the workpiece loading/unloading zone A. The third transfer mechanism 14 transfers each wafer, which is placed on the chuck table 6 positioned at the workpiece loading/unloading zone A and has been subjected to grinding, to the thermocompression-bonding sheet rinsing unit 10 and the ground-surface rinsing unit 11. The thermocompression-bonding sheet rinsing unit 10 is arranged between the workpiece loading/unloading zone A and the ground-surface rinsing unit 11, and includes a rolling brush 10a and a pair of rinse water supply pipes 10b positioned to face each other with the rolling brush 10a interposed therebetween.

On the operator's side of the machine housing 2 where the first transfer mechanism 12 is arranged, an operation panel 15 and a display monitor 16 are arranged. The operation panel 15 is used to instruct grinding work and also to specify instruct grinding conditions. The display monitor 16 displays the scene during grinding, and owing to the inclusion of a touch panel function, is configured to permit performing an instruction of work as needed. Also arranged in the grinding apparatus 1 in the embodiment are, in addition to the elements described above, a control unit controlling individual operating parts, thickness measuring instruments (depiction omitted each) arranged adjacent the coarse grinding zone B and the finish grinding zone C, respectively, for measuring the thickness of each wafer, and the like.

The grinding apparatus 1 in the embodiment generally has such a configuration as described above. Referring to FIGS.

4 through 7B, a description will be made regarding the grinding step and the thermocompression-bonding sheet rinsing step to be performed using the grinding apparatus 1. The grinding step will hereinafter be described based on an example in which the grinding step consists of the coarse grinding step to be performed by the coarse grinding unit 3 and the finish grinding step to be performed by the finish grinding unit 4, although the present invention is not limited to such a grinding step and the grinding step may consist of a single grinding step only.

Figure 5:
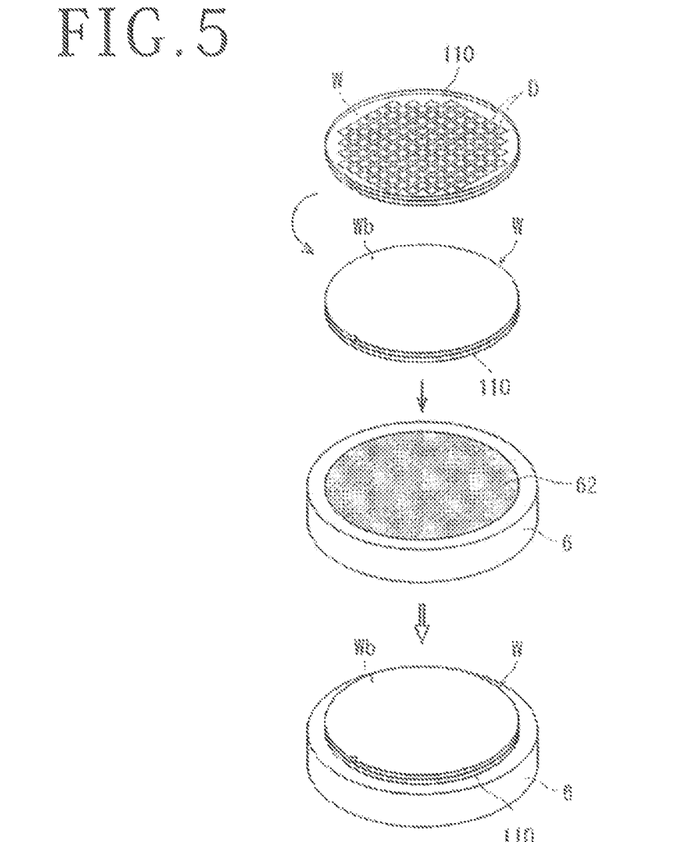
FIG. 5 is a perspective view depicting a scene of holding the wafer on one of chuck tables of the grinding apparatus depicted in FIG. 4.

As depicted in FIG. 5, the wafer W with the thermocompression-bonding sheet 110 integrated therewith is placed, with the back side Wb directed upward and the side of the thermocompression-bonding sheet 110 directed downward, on the suction chuck 62 of the chuck table 6, the suction chuck 62 having been positioned at the workpiece loading/unloading zone A of the grinding apparatus 1. The suction chuck 62 of the chuck table 6 is connected to the undepicted suction means, and the suction means is operated to apply the suction force so that the wafer W is held under suction on the chuck table 6.

Figure 6:
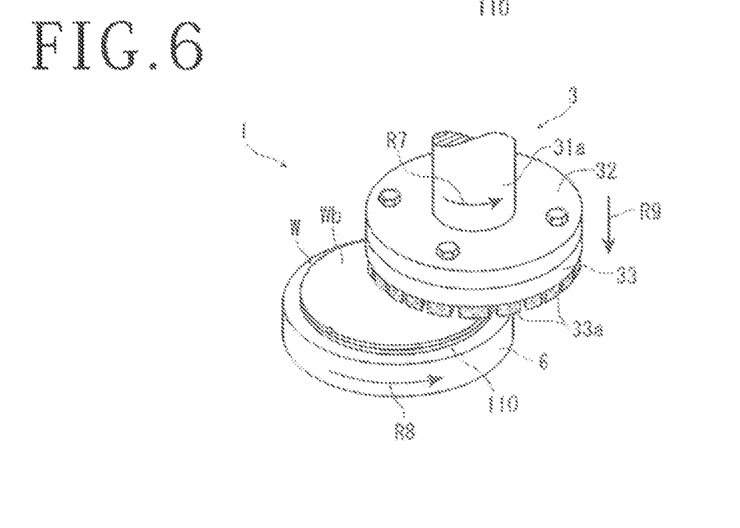
FIG. 6 is a perspective view depicting a scene of performing a grinding step by the grinding apparatus of FIG. 4 in the processing method.

After the holding of the wafer W under suction on the chuck table 6 positioned at the workpiece loading/unloading zone A, the turn table 5 is rotated in the direction indicated by arrow R5 to position the chuck table 6, on which the wafer W is held under suction, right below the coarse grinding unit 3. As depicted in FIG. 6, the chuck table 6 is next rotated in a direction indicated by arrow R8, for example, at 300 rpm while rotating the spindle 31a of the coarse grinding unit 3 in a direction indicated by arrow R7, for example, at 6,000 rpm. Then, the grinding stones 33a are brought into contact with the back side Wb of the wafer W, and the coarse grinding wheel 33 is subjected to downward grinding feed, specifically in a direction perpendicular to the chuck table 6 as indicated by arrow R9, for example, at a grinding feed rate of 1 μm/sec. During the grinding feed, the grinding water L1 is supplied from the lower surface of the coarse grinding wheel 33 to the surface of the wafer W, the surface being under coarse grinding, in other words, to the back side Wb of the wafer W by way of the spindle 31a. Further, the coarse grinding may be allowed to proceed while measuring the thickness of the wafer W by an undepicted contact measuring gauge at the same time as the coarse grinding. In this manner, the backside Wb of the wafer W is coarsely ground to a desired thickness, and the coarse grinding step has now been completed.

After the completion of the coarse grinding step as described above, the turn table 5 is rotated in the direction indicated by arrow R5 in FIG. 4 to move the chuck table 6 to right below the finish grinding unit 4. After the movement of the chuck table 6 to right below the finish grinding unit 4, the chuck table 6 is rotated, for example, at 300 rpm while rotating the spindle 41a of the finish grinding unit 4, for example, at 6,000 rpm. Then, the grinding stones 43a are brought into contact with the back side Wb of the wafer W, and the finish grinding wheel 43 is subjected to downward grinding feed, specifically in a direction perpendicular to the chuck table 6, for example, at a grinding feed rate of 0.1 μm/sec. During the grinding feed, the grinding water L1 is supplied from the lower surface of the finish grinding wheel 43 to the surface of the wafer W, the surface being under finish grinding, in other words, to the back side Wb of the wafer W by way of the spindle 41a. Further, the finish grinding may be allowed to proceed while measuring the thickness of the wafer W by an undepicted contact measuring gauge at the same time as the finish grinding. In this manner, the backside Wb of the wafer W is finish-ground to a desired thickness, and the finish grinding step has now been completed. Here, the grinding step consisting of the above described coarse grinding step and this finish grinding step has been completed.

Figure 7A:
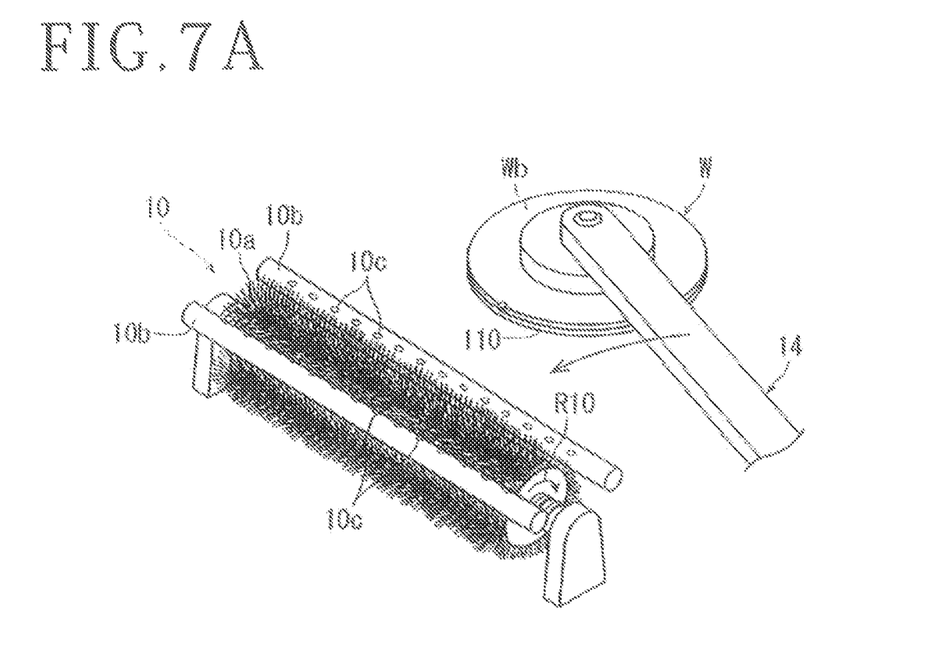
FIG. 7A is a perspective view depicting an illustrative performance of a thermocompression-bonding sheet rinsing step in the processing method.
Figure 7B:
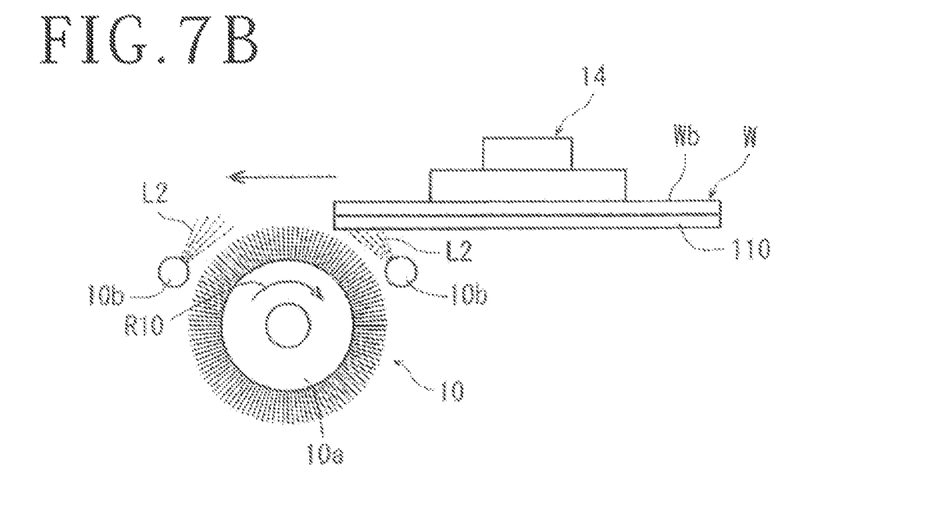
FIG. 7B is a side view depicting the illustrative performance of FIG. 7A.

After the completion of the grinding step as described above, the turn table 5 is rotated in the direction indicated by arrow R5 to move the chuck table 6 to the workpiece loading/unloading zone A. With the wafer W being suctioned on the side of the back side Wb thereof as depicted in FIG. 7A, the third transfer mechanism 14 is operated to move the wafer W from the chuck table 6 positioned at the workpiece loading/unloading zone A and further to allow the side of the thermocompression-bonding sheet 110 to pass over the thermocompression-bonding sheet rinsing unit 10 disposed between the workpiece loading/unloading zone A and the ground-surface rinsing unit 11. As described above, the thermocompression-bonding sheet rinsing unit 10 includes the rolling brush 10a and the paired rinse water supply pipes 10b and 10b disposed facing each other with the rolling brush 10a interposed therebetween. When allowing the wafer W to pass over the thermocompression-bonding sheet rinsing unit 10, an undepicted rotary drive mechanism is operated to rotate the rolling brush 10a in a direction indicated by arrow R10, and at the same time, rinse water L2 (see FIG. 7B) is ejected from ejection nozzles 10c formed through the rinse water supply pipes 10b and 10b. During the passing of the wafer W over the thermocompression-bonding sheet rinsing unit 10, the rinse water L2 ejected from the rinse water supply pipe 110b is supplied toward the thermocompression-bonding sheet 110, and while rotating, bristles of the rolling brush 10a come into contact with the entire area of the thermocompression-bonding sheet 110 so that grinding swarf stuck on the surface of the thermocompression-bonding sheet 110 is removed. As a result of the passing of the wafer W over the thermocompression-bonding sheet rinsing unit 10 as described above, grinding swarf is removed from the entire area of the thermocompression-bonding sheet 110 bonded to the front side Wa of the wafer W, and the thermocompression-bonding sheet rinsing step has now been completed.

After the completion of the thermocompression-bonding sheet rinsing step as described above, the wafer W suctioned by the third transfer mechanism 14 is transferred, as is, to the ground-surface rinsing unit 11, and the ground surface of the wafer W, in other words, the back side Wb of the wafer W is rinsed by the ground-surface rinsing unit 11 (ground-surface rinsing step). The wafer W rinsed by the ground-surface rinsing step is suctioned by the first transfer mechanism 12, and is transferred to a predetermined position in the second cassette 8 and is stored there.

(Separation Step)

After the completion of the grinding step, the thermocompression-bonding sheet rinsing step, and the ground-surface rinsing step as described above, a separation step is performed to separate the thermocompression-bonding sheet 110, which has been integrated with the wafer W in the above described integration step, from the front side Wa of the wafer stored in the second cassette 8. Regarding the separation step, a description will hereinafter be made with reference to FIGS. 8 and 9.

Figure 8:
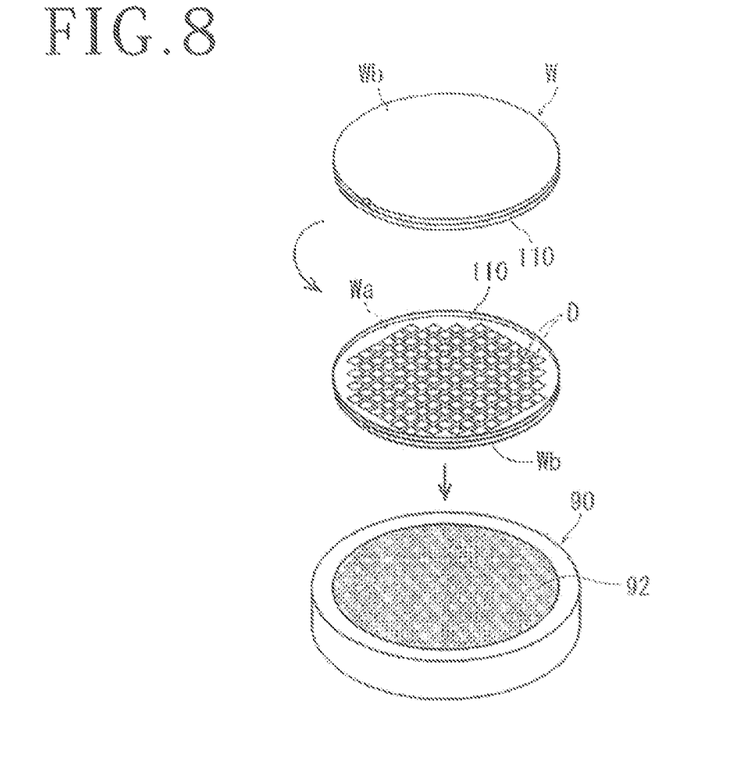
FIG. 8 is a perspective view depicting a scene of placing the wafer on a separating chuck table to perform a separation step in the processing method.
Figure 9:
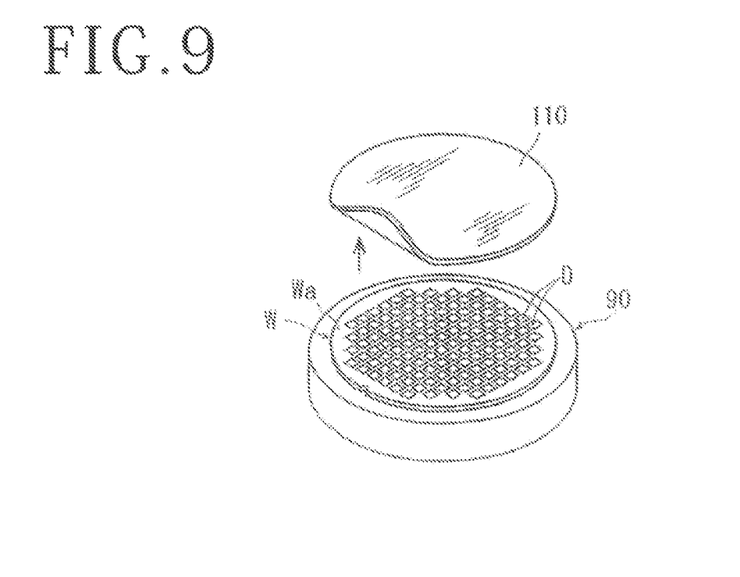
FIG. 9 is a perspective view depicting an illustrative performance of the separation step in the processing method.

When performing the separation step, a separating chuck table 90 as depicted in FIG. 8 is provided. The separating chuck table 90 centrally includes a disc-shaped suction chuck 92 made from a porous ceramic having air permeability. The suction chuck 92 is connected to the undepicted suction means. The wafer W, which has been subjected to the grinding, is unloaded from the second cassette 8, and with the front side Wa having the thermocompression-bonding sheet 110 bonded thereon being directed upward, the back side Wb is placed on the suction chuck 92 and is held under suction there. Next, undepicted cooling means or heating means is operated to locally apply a cooling treatment or heating treatment to an outer peripheral portion of the thermocompression-bonding sheet 110 on the wafer W held under suction on the suction chuck 92, thereby inducing a temperature difference between the outer peripheral portion and the remaining portion other than the outer peripheral portion to bring the thermocompression-bonding sheet 110 into a state that separation of the thermocompression-bonding sheet 110 is facilitated from its outer peripheral portion. As depicted in FIG. 9, with the wafer W being held under suction on the suction chuck 92, the thermocompression-bonding sheet 110 is then separated from the outer peripheral portion subjected to the above described cooling treatment or heating treatment. The separation step has now been completed.

According to the embodiment described above, the thermocompression-bonding sheet 110 disposed on the front side Wa of the wafer W has been planarized beforehand. Despite the grinding step is performed on the wafer W held on the chuck table 6 of the grinding apparatus 1, grinding swarf is therefore hardly allowed to enter from a gap between the thermocompression-bonding sheet 110 and the holding surface of the chuck table 6 so that grinding swarf is suppressed from sticking to the thermocompression-bonding sheet 110. Even if grinding swarf sticks to the thermocompression-bonding sheet 110 through the performance of the grinding step, the adhesion force of the grinding swarf is weak owing to the planarization of the thermocompression-bonding sheet 110, and hence the removal of the grinding swarf from the surface of the thermocompression-bonding sheet 110 is ensured by the thermocompression-bonding sheet rinsing unit 10. It is therefore possible to resolve the problem that upon transfer of the wafer W from the grinding step to the next step, the wafer W may become a contamination source in the next step.

In the embodiment described above, a polyethylene sheet is adopted as the thermocompression-bonding sheet 110. However, the present invention is not limited to such a polyethylene sheet, and the thermocompression-bonding sheet 110 can be selected from polyolefin-based sheets or polyester-based sheets as desired.

If the thermocompression-bonding sheet 110 is selected from polyolefin-based sheets, it can be selected from either a polypropylene sheet or a polystyrene sheet as an alternative to the polyethylene sheet. If a polypropylene sheet is selected as the thermocompression-bonding sheet 110, the temperature may preferably be set at 160° C. to 180° C. when heating it in the integration step. If a polystyrene sheet is selected as the thermocompression-bonding sheet 110, on the other hand, the temperature may preferably be set at 220° C. to 240° C. when heating it in the integration step.

Further, if the thermocompression-bonding sheet 110 is selected from polyester-based sheets, it can be selected from either a polyethylene terephthalate sheet or a polyethylene naphthalate sheet. If a polyethylene terephthalate sheet is selected as the thermocompression-bonding sheet 110, the temperature may preferably be set at 250° C. to 270° C. when heating it in the integration step. If a polyethylene naphthalate sheet is selected as the thermocompression-bonding sheet 110, on the other hand, the temperature may preferably be set at 160° C. to 180° C. when heating it in the integration step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for a wafer, on a front side of which a plurality of devices are formed in a grid pattern defined by a plurality of intersecting streets, to grind a back side of the wafer, comprising:
    a thermocompression-bonding sheet arrangement step of arranging, on the front side of the wafer, a thermocompression-bonding sheet of a size sufficient to cover the wafer;
    an integration step of pressing the thermocompression-bonding sheet under heat by a planarizing member, so that the thermocompression-bonding sheet is planarized and the thermocompression-bonding sheet and the wafer are integrated together;
    a grinding step of, after the integration step, holding the wafer on a side of the thermocompression-bonding sheet on a chuck table of a grinding apparatus, and grinding the wafer to a desired thickness while supplying grinding water to the back side of the wafer; and
    a thermocompression-bonding sheet rinsing step of, after the grinding step, unloading the integrated wafer and the thermocompression-bonding sheet from the chuck table, and rinsing the thermocompression-bonding sheet with rinse water that is directed towards the thermocompression-bonding sheet.

2. The processing method according to claim 1, wherein the thermocompression-bonding sheet is formed from a polyolefin-based sheet or a polyester-based sheet.

3. The processing method according to claim 1, wherein the thermocompression-bonding sheet is a polyolefin-based sheet selected from a group consisting of a polyethylene sheet, a polypropylene sheet, and a polystyrene sheet.

4. The processing method according to claim 3, wherein, in the integration step, the thermocompression-bonding sheet is pressed at 120° C. to 140° C., 160° C. to 180° C., or 220° C. to 240° C. if the thermocompression-bonding sheet is the polyethylene sheet, the polypropylene sheet, or the polystyrene sheet, respectively.

5. The processing method according to claim 1, wherein the thermocompression-bonding sheet is a polyester-based sheet selected from a group consisting of a polyethylene terephthalate sheet and a polyethylene naphthalate sheet.

6. The processing method according to claim 5, wherein, in the integration step, the thermocompression-bonding sheet is pressed at 250° C. to 270° C. or 160° C. to 180° C. if the thermocompression-bonding sheet is the polyethylene terephthalate sheet or the polyethylene naphthalate sheet, respectively.

7. The processing method according to claim 1, wherein the thermocompression-bonding sheet rinsing step also includes contacting the thermocompression-bonding sheet with bristles of a brush.

8. The processing method according to claim 1, wherein the thermocompression-bonding sheet rinsing step also includes rotating a rolling brush that includes bristles thereon and contacting the thermocompression-bonding sheet with the bristles of the rotating rolling brush.

9. The processing method according to claim 1, wherein the thermocompression-bonding sheet rinsing step also includes using a transfer mechanism to unload the integrated wafer and the thermocompression-bonding sheet from the chuck table and to move the integrated wafer and the thermocompression-bonding sheet to a rinsing unit that faces the thermocompression-bonding sheet.

10. The processing method according to claim 9, wherein the rinsing unit includes a rolling brush that includes bristles thereon and that is configured and arranged to be rotated while the bristles of the rolling brush make contact with the thermocompression-bonding sheet.

11. The processing method according to claim 1, wherein the thermocompression-bonding sheet rinsing step also includes using a transfer mechanism to unload the integrated wafer and the thermocompression-bonding sheet from the chuck table and to move the integrated wafer and the thermocompression-bonding sheet to a position above a rinsing unit, such that the rinsing unit faces the thermocompression-bonding sheet.

12. The processing method according to claim 11, wherein the rinsing unit includes a rolling brush that includes bristles thereon and that is configured and arranged to be rotated while the bristles of the rolling brush make contact with the thermocompression-bonding sheet.

13. A processing method for a wafer, on a front side of which a plurality of devices are formed in a grid pattern defined by a plurality of intersecting streets, to grind a back side of the wafer, comprising:

a thermocompression-bonding sheet arrangement step of arranging, on the front side of the wafer, a thermocompression-bonding sheet of a size sufficient to cover the wafer;

an integration step of pressing the thermocompression-bonding sheet under heat by a planarizing member, so that the thermocompression-bonding sheet is planarized and the thermocompression-bonding sheet and the wafer are integrated together;

a grinding step of, after the integration step, holding the wafer on a side of the thermocompression-bonding sheet on a chuck table of a grinding apparatus, and grinding the wafer to a desired thickness while supplying grinding water to the back side of the wafer; and a thermocompression-bonding sheet rinsing step of, after the grinding step, unloading the integrated wafer and the thermocompression-bonding sheet from the chuck table, and rinsing the thermocompression-bonding sheet, and wherein the method further comprises:

a separation step of, after the thermocompression-bonding sheet rinsing step, locally heating or cooling the thermocompression-bonding sheet to induce a temperature difference in the thermocompression-bonding sheet, and separating the thermocompression-bonding sheet from the front side of the wafer.

14. A processing method for a wafer, on a front side of which a plurality of devices are formed in a grid pattern defined by a plurality of intersecting streets, to grind a back side of the wafer, comprising:

a thermocompression-bonding sheet arrangement step of arranging, on the front side of the wafer, a thermocompression-bonding sheet of a size sufficient to cover the wafer, wherein the thermocompression-bonding sheet is placed directly on the front side of the wafer, without an adhesive layer between the thermocompression-bonding sheet and the wafer;

an integration step of pressing the thermocompression-bonding sheet under heat by a planarizing member, so that the thermocompression-bonding sheet is planarized and the thermocompression-bonding sheet and the wafer are integrated together;

a grinding step of, after the integration step, holding the wafer on a side of the thermocompression-bonding sheet on a chuck table of a grinding apparatus, and grinding the wafer to a desired thickness while supplying grinding water to the back side of the wafer; and a thermocompression-bonding sheet rinsing step of, after the grinding step, unloading the integrated wafer and the thermocompression-bonding sheet from the chuck table, and rinsing the thermocompression-bonding sheet.

15. The processing method according to claim 14, wherein the thermocompression-bonding sheet is formed from a polyolefin-based sheet or a polyester-based sheet.

16. The processing method according to claim 14, wherein the thermocompression-bonding sheet is a polyolefin-based sheet selected from a group consisting of a polyethylene sheet, a polypropylene sheet, and a polystyrene sheet.

17. The processing method according to claim 16, wherein, in the integration step, the thermocompression-bonding sheet is pressed at 120° C. to 140° C., 160° C. to 180° C., or 220° C. to 240° C. if the thermocompression-bonding sheet is the polyethylene sheet, the polypropylene sheet, or the polystyrene sheet, respectively.

18. The processing method according to claim 14, wherein the thermocompression-bonding sheet is a polyester-based sheet selected from a group consisting of a polyethylene terephthalate sheet and a polyethylene naphthalate sheet.

19. The processing method according to claim 18, wherein, in the integration step, the thermocompression-bonding sheet is pressed at 250° C. to 270° C. or 160° C. to 180° C. if the thermocompression-bonding sheet is the polyethylene terephthalate sheet or the polyethylene naphthalate sheet, respectively.

* * * * *